(12) United States Patent
Zhang

(10) Patent No.: US 11,997,884 B2
(45) Date of Patent: May 28, 2024

(54) DISPLAY SUBSTRATE, DISPLAY PANEL, AND DISPLAY APPARATUS

(71) Applicant: BOE Technology Group Co., Ltd., Beijing (CN)

(72) Inventor: Yue Zhang, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 354 days.

(21) Appl. No.: 17/630,355

(22) PCT Filed: Apr. 20, 2021

(86) PCT No.: PCT/CN2021/088539
§ 371 (c)(1),
(2) Date: Jan. 26, 2022

(87) PCT Pub. No.: WO2021/238507
PCT Pub. Date: Dec. 2, 2021

(65) Prior Publication Data
US 2022/0293703 A1    Sep. 15, 2022

(30) Foreign Application Priority Data
May 29, 2020  (CN) .......... 202010478130.1

(51) Int. Cl.
*H10K 59/122* (2023.01)
*H10K 59/35* (2023.01)
*H10K 59/88* (2023.01)

(52) U.S. Cl.
CPC ......... *H10K 59/122* (2023.02); *H10K 59/352* (2023.02); *H10K 59/353* (2023.02); *H10K 59/88* (2023.02)

(58) Field of Classification Search
CPC ..... H10K 59/122; H10K 59/353; H10K 59/88
(Continued)

(56) References Cited

U.S. PATENT DOCUMENTS 10,608,208 B2    3/2020  Nozawa et al.
2018/0286934 A1  10/2018  Zhao
(Continued)

FOREIGN PATENT DOCUMENTS

CN    203910804 U    10/2014
CN    106920828 A    7/2017
(Continued)

OTHER PUBLICATIONS

CN202010478130.1 first office action1.

*Primary Examiner* — Christopher M Raabe
(74) *Attorney, Agent, or Firm* — IPro, PLLC

(57) ABSTRACT

The display substrate includes sub-pixels of different colors. The sub-pixels are arranged as pixel columns in a first direction. Sub-pixels in the same pixel column have the same color. The display substrate includes a substrate, a first electrode layer, a pixel defining structure and an organic light-emitting layer. The pixel defining structure includes a first pixel defining structure, and a second pixel defining structure. The organic light-emitting layer includes color light-emitting layers with different colors. One light-emitting layer includes main body parts in a display region and a virtual part in a bezel region. The virtual part is connected to at least two main body parts in the light-emitting layer of the same color.

17 Claims, 10 Drawing Sheets

(58) Field of Classification Search
USPC .......................................................... 313/504
See application file for complete search history.

(56) References Cited

U.S. PATENT DOCUMENTS

| | | | |
|---|---|---|---|
| 2019/0305059 A1 | 10/2019 | Hou | |
| 2020/0020861 A1 | 1/2020 | Han et al. | |
| 2020/0303465 A1* | 9/2020 | Joo | H10K 59/38 |
| 2021/0097919 A1 | 4/2021 | Chai et al. | |
| 2021/0359008 A1 | 11/2021 | Zhang | |
| 2024/0074246 A1* | 2/2024 | Choi | G06F 1/1616 |

FOREIGN PATENT DOCUMENTS

| | | | |
|---|---|---|---|
| CN | 107331691 A | 11/2017 | |
| CN | 107357467 A | 11/2017 | |
| CN | 107385392 A | 11/2017 | |
| CN | 108538886 A | 9/2018 | |
| CN | 109087935 A | 12/2018 | |
| CN | 109309112 A | 2/2019 | |
| CN | 110098220 A | 8/2019 | |
| CN | 110660836 A | 1/2020 | |
| CN | 110752244 A | 2/2020 | |
| CN | 110767697 A | 2/2020 | |
| CN | 111063708 A | 4/2020 | |
| CN | 111564479 A | 8/2020 | |
| CN | 111599849 A | 8/2020 | |

* cited by examiner

DISPLAY SUBSTRATE, DISPLAY PANEL, AND DISPLAY APPARATUS

CROSS-REFERENCE TO RELATED APPLICATIONS

This application is a national phase entry under 35 U.S.C. § 371 of International Application No. PCT/CN2021/088539, filed on Apr. 20, 2021, which claims priority of Chinese Patent Application No. 202010478130.1, filed with the China National Intellectual Property Administration (CNIPA) on May 29, 2020, and entitled "Array Substrate, Display Panel and Display Apparatus", the entire content of which is incorporated herein by reference.

FIELD

The present disclosure relates to the technical field of display, in particular to a display substrate, a display panel and a display apparatus.

BACKGROUND

An Organic Light-Emitting Diode (OLED) display technology is widely applied and has a good prospect due to its advantages of being light and thin, bendable and high in contrast and the like.

As for an OLED product manufactured through an ink-jet printing method, in an ink-jet printing drying and film forming process, solvent vapor quickly volatilizes at the edge of a droplet, in this way, solution of the droplet flows from the center to the edge. This kind of flowing drives a solute to migrate to the edge of the droplet and be finally deposited at the edge, so as to form a depositional topography with a thick edge and thin center, namely a "coffee-ring effect". Consequently, film forming of an organic light-emitting layer in a sub-pixel is not uniform, leading to nonuniform light emitting of the OLED product, and influence on a display effect.

SUMMARY

At a first aspect, an embodiment of the present disclosure provides a display substrate, including sub-pixels with at least two different colors. The sub-pixels are arranged as pixel columns in a first direction, and all sub-pixels at the same pixel column have the same color. The display substrate includes a substrate, a first electrode layer, a pixel defining structure, and an organic light-emitting layer.

The substrate includes a display region and a bezel region around the display region.

The first electrode layer is on one side of the substrate and includes first electrodes in one-to-one correspondence with the sub-pixels.

The pixel defining structure includes a first pixel defining structure and a second pixel defining structure with a thickness being smaller than that of the first pixel defining structure. The first pixel defining structure includes first blocking walls in the display region and a second blocking wall in the bezel region. The first blocking wall extends in the first direction. Adjacent first blocking walls limit pixel column openings in one-to-one correspondence with the pixel columns. The second blocking wall extends in a second direction and is connected with first blocking walls limiting at least two adjacent pixel column openings of the same color. The second pixel defining structure includes third blocking walls in the display region. The third blocking walls are in the pixel column openings so as to divide the pixel column openings into pixel openings in one-to-one correspondence with the sub-pixels. An orthographic projection of one pixel opening on the substrate is within an orthographic projection of one first electrode on the substrate, and the second direction intersects with the first direction.

The organic light-emitting layer at least includes two light-emitting layers with different colors. At least one light-emitting layer each of one color includes main body parts in the display region and a virtual part in the bezel region. The main body parts overspread a region limited by the corresponding pixel column openings, and the virtual part is connected with at least two adjacent main body parts in the light-emitting layer with the same color.

Optionally, the bezel region includes a virtual pixel region, and both a first virtual part and a second virtual part are in the virtual pixel region.

Optionally, the virtual pixel region includes a first virtual pixel region and a second virtual pixel region located on one side of the display region away from the first virtual pixel region.

The at least one light-emitting layer includes a first color light-emitting layer and a second color light-emitting layer. The first color light-emitting layer includes first main body parts and the first virtual part, and the second color light-emitting layer includes second main body parts and the second virtual part.

Both the first virtual part and the second virtual part extend in the second direction. The first virtual part is in the first virtual pixel region, and the second virtual part is in the second virtual pixel region.

Optionally, the first color light-emitting layer includes at least two first virtual parts, and each first virtual part is connected with part of the first main body parts. The second color light-emitting layer includes at least two second virtual parts, and each second virtual part is connected with part of the second main body parts.

Optionally, the at least one light-emitting layer further includes a third color light-emitting layer, and the third color light-emitting layer includes third main body parts and third virtual parts.

In the second direction, the first main body parts and the second main body parts are arranged alternately, and one third main body part is disposed between adjacent first main body part and second main body part.

The third virtual parts are in the first virtual pixel region and/or the second virtual pixel region.

Optionally, the first color light-emitting layer includes one first virtual part, and the first virtual part is connected with all the first main body parts. The second color light-emitting layer includes one second virtual part, and the second virtual part is connected with all the second main body parts.

Optionally, the organic light-emitting layer further includes a third color light-emitting layer, and the third color light-emitting layer includes third main body parts. In the second direction, the first main body parts, the second main body parts and the third main body parts are arranged alternately.

Optionally, the at least one light-emitting layer further includes a third color light-emitting layer, and the third color light-emitting layer includes third main body parts and third virtual parts.

In the second direction, the first main body parts and the second main body parts are arranged alternately, and one third main body part is disposed between adjacent first main body part and second main body part.

In the second direction, the third virtual parts are arranged alternately in the first virtual pixel region and the second virtual pixel region.

Optionally, the organic light-emitting layer further includes a third color light-emitting layer, and the third color light-emitting layer includes a third main body parts. In the second direction, the first main body parts, the second main body parts and the third main body parts are arranged alternately.

Optionally, the third color light-emitting layer is a blue light-emitting layer.

In the second direction, widths of both the first main body part and the second main body part are smaller than a width of the third main body part.

Optionally, the third color light-emitting layer is a blue light-emitting layer.

In the second direction, the first main body part, the second main body part and the third main body part have the same width.

Optionally, orthographic projections of the first virtual parts and the second virtual parts on the substrate do not mutually overlap with orthographic projections of the first electrodes on the substrate.

Optionally, a thickness of the first pixel defining structure is 1.2 μm-2 μm, and a thickness of the second pixel defining structure is 0.5 μm-1 μm.

Optionally, the first pixel defining structure and the second pixel defining structure are integrally formed by adopting same material.

Optionally, the first pixel defining structure is on one side of the second pixel defining structure away from the substrate.

Optionally, a material of the first pixel defining structure is a lyophobic material, and a material of the second pixel defining structure is a lyophilic material.

At the second aspect, an embodiment of the present disclosure provides a display panel, including the above display substrate.

At the third aspect, an embodiment of the present disclosure provides a display apparatus, including the above display panel.

DETAILED DESCRIPTION OF THE EMBODIMENTS

The present disclosure is described below in detail. Examples of embodiments of the present disclosure are shown in drawings. The same or similar reference numbers represent the same or similar components or components with the same or similar functions from beginning to end. In addition, if detailed description of a known technology is unnecessary for shown features of the present disclosure, it is omitted. The embodiments described below with reference to the drawings are exemplary, are only configured to explain the present disclosure, and cannot be interpreted as limitation to the present disclosure.

It should be understood by those skilled in the art that unless otherwise defined, all the terms (including technical terms and scientific terms) used herein have the same meanings generally understood by those ordinarily skilled in the art to which the present disclosure belongs. It should be further understood that those terms, such as defined in a general dictionary, should be understood as having meanings consistent with meanings in the context of a related technology, and are not explained with idealized or excessively official implication unless specifically defined like here.

Those skilled in the art should understand that unless expressly stated, singular forms "one", "a", "the said" and "this" used here may also include plural forms. It should be further understood that the wording "include" used in the specification of the present disclosure refers to existence of a feature, an integer, a step, an operation, an element and/or a component, but not excluding existence or adding one or more other features, integers, steps, operations, elements, components and/or their combinations. The wording "and/or" used here include all or any unit and all combinations of one or more associated listed items.

An inventor of the present disclosure considered that as for an OLED product manufactured through an ink-jet printing method, in an ink-jet printing drying and film forming process, solvent vapor quickly volatilizes at the edge of a droplet, in this way, solution of the droplet flows from the center to the edge. This kind of flowing drives a solute to migrate to the edge of the droplet and be finally deposited at the edge, so as to form a depositional topography with a thick edge and thin center, namely a "coffee-ring effect". Consequently, film forming of an organic light-emitting layer in a sub-pixel is not uniform, leading to nonuniform light emitting of the OLED product, and influence on a display effect.

A display substrate, a display panel and a display apparatus provided by the present disclosure aim to solve the above technical problems in the related technology.

The technical solutions of the present disclosure and how to solve the above technical problem through the technical solutions of the present disclosure are illustrated below in detail through the specific embodiments.

Figure 1:
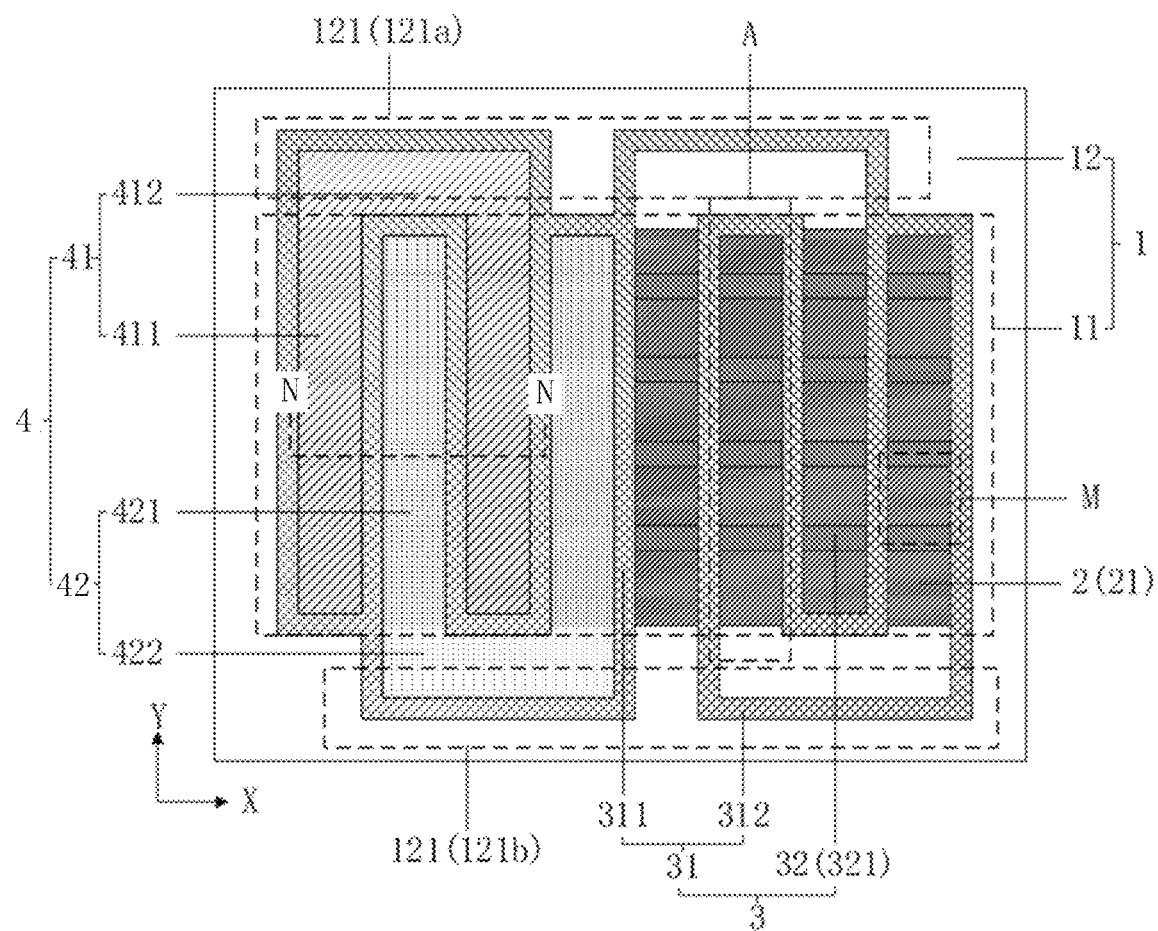
FIG. 1 is a schematic top view of a display substrate provided by an embodiment of the present disclosure.

Embodiments of the present disclosure provide a display substrate. The display substrate includes at least two sub-pixels of different colors. The sub-pixels are arranged as pixel columns in a first direction, and all sub-pixels at the same pixel column have the same color. As shown in FIG. 1, the display substrate provided by the embodiment of the present disclosure includes a substrate 1, a first electrode layer 2, a pixel defining structure 3, and an organic light-emitting layer 4.

The substrate 1 includes a display region 11 and a bezel region 12 around the display region 11.

The first electrode layer 2 is on one side of the substrate 1 and includes first electrodes 21 in one-to-one correspondence with the sub-pixels.

The pixel defining structure 3 includes a first pixel defining structure 31 and a second pixel defining structure 32 with a thickness being smaller than that of the first pixel defining structure 31. The first pixel defining structure 31 includes first blocking walls 311 in the display region 11 and second blocking walls 312 in the bezel region 12. The first blocking wall 311 extends in the first direction Y. Adjacent first blocking walls 311 define pixel column openings 'A' in one-to-one correspondence with the pixel columns. The second blocking wall 312 extends in a second direction X and is connected with first blocking walls 311 limiting at least two adjacent pixel column openings 'A' of the same color. The second pixel defining structure 32 includes a plurality of third blocking walls 321 in the display region 11. The third blocking walls 321 are in the pixel column openings 'A' so as to divide the pixel column openings 'A' into pixel openings M in one-to-one correspondence with the sub-pixels. An orthographic projection of one pixel opening M on the substrate 1 is within an orthographic projection of one first electrode 21 on the substrate 1. The second direction X intersects with the first direction Y.

The organic light-emitting layer 4 at least includes light-emitting layers with two different colors. The light-emitting layer of at least one color includes main body parts in the display region and a virtual part in the bezel region. The main body parts overspread a region limited by the corresponding pixel column openings. The virtual part is connected with at least two adjacent main body parts in the light-emitting layer of the same one color. For example, the light-emitting layer of at least one color includes: a first color light-emitting layer 41 and a second color light-emitting layer 42. The first color light-emitting layer 41 includes first main body parts 411 in the display region 11 and a first virtual part 412 in the bezel region 12. The first main body parts 411 overspread a region limited by the corresponding pixel column openings 'A', and the first virtual part 412 is connected with at least two adjacent first main body parts 411. The second color light-emitting layer 42 includes second main body parts 421 in the display region 11 and a second virtual part 422 in the bezel region 12. The second main body parts 421 overspread the region limited by the corresponding pixel column openings 'A', and the second virtual part 422 is connected with at least two adjacent second main body parts 421.

It should be noted that although in the display substrate shown in FIG. 1, both the first color light-emitting layer 41 and the second color light-emitting layer 42 are connected in the bezel region 12, in specific implementation, it may also be designed that one of the first color light-emitting layer 41 and the second color light-emitting layer 42 is connected in the bezel region 12 according to the actual condition.

It should be noted that although in the display substrate shown in FIG. 1, the first direction Y and the second direction X are perpendicular to each other, in specific implementation, an included angle between the first direction Y and the second direction X may also be adaptively adjusted according to a shape of the sub-pixels, and an angle of the included angle between the first direction Y and the second direction X is not specifically limited.

The display substrate provided by the embodiments of the present disclosure utilizes the first pixel defining structure 31 to form the plurality of openings 'A' corresponding to the pixel columns, and utilizes the second pixel defining structure 32 to divide the sub-pixels, and the pixel column openings 'A' corresponding to the sub-pixels of at least one color are communicated in the virtual parts, so that ink (a solution containing an organic light-emitting layer material) forming the sub-pixels of the at least one color can be circulated in the plurality of pixel column openings 'A'. Even if part of the pixel column openings 'A' is not communicated, ink in the part of pixel column openings 'A' may be circulated in the part of pixel column openings 'A'. In this way, uniformity of a thickness of the organic light-emitting layer 4 is improved advantageously, thereby improving a display effect of a display apparatus.

Optionally, as shown in FIG. 1, in the display substrate provided by embodiments of the present disclosure, the bezel region 12 may include a virtual pixel region 121. Virtual parts such as the first virtual part 412 and the second virtual part 422 are both located in the virtual pixel region 121. In the display substrate of the embodiments, the virtual parts are arranged in the virtual pixel region 121, so that the virtual parts are close to the display region 11, thereby saving an organic light-emitting material to reduce a production cost.

Optionally, in the display substrate provided by embodiments of the present disclosure, orthographic projections of the first virtual part 412 and the second virtual part 422 on the substrate 1 do not mutually overlap with the orthographic projections of first electrodes 21 on the substrate 1. That is, in the embodiments, the first electrode layer 2 in the virtual pixel region 121 may be removed, and thus circuit failure of the virtual pixel region 121 can be effectively avoided.

Figure 2:
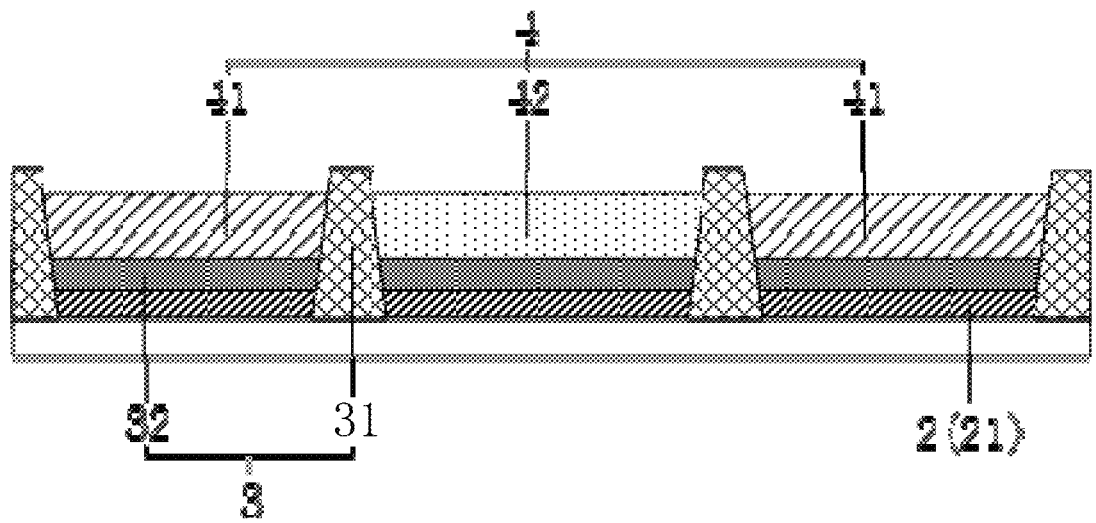
FIG. 2 is a schematic section diagram of the display substrate shown in FIG. 1 along a line N-N.
Figure 3:
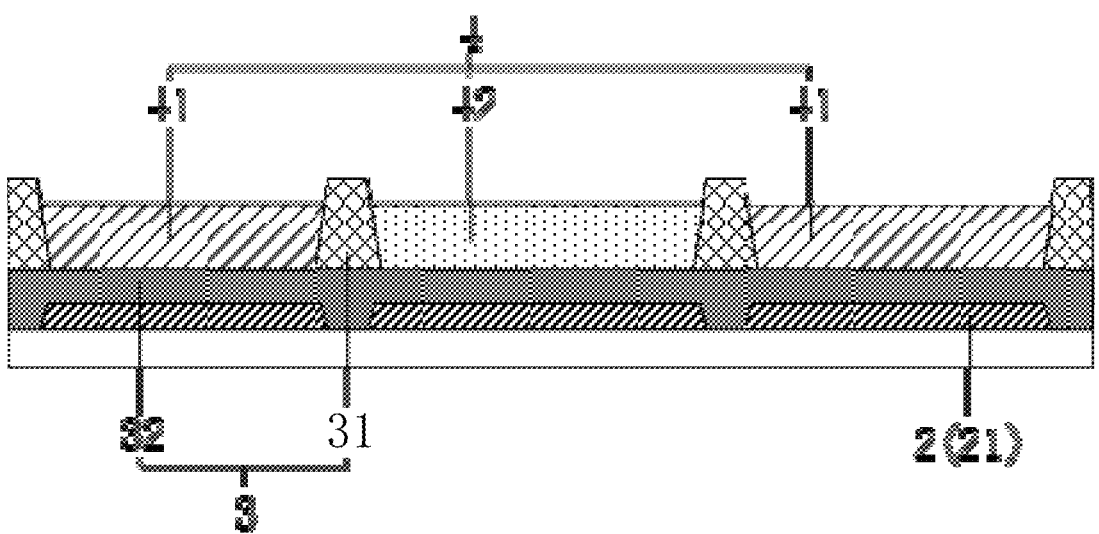
FIG. 3 is a schematic section diagram of the display substrate shown in FIG. 1 along a line N-N.

Optionally, as shown in FIG. 2 and FIG. 3, in the display substrate provided by embodiments of the present disclosure, a thickness of the first pixel defining structure 31 is generally 1.2 µm-2 µm, and a thickness of the second pixel defining structure 32 is generally 0.5 µm-1 µm. Optionally, the thickness of the first pixel defining structure 31 is preferably 1.5 µm, and the thickness of the second pixel defining structure 32 is 0.8 µm.

The display substrate provided by the embodiments of the present disclosure adopts the first pixel defining structure 31 and the second pixel defining structure 32 with the above thicknesses, thus it can be ensured that the second pixel defining structure 32 prevents short circuit of the first electrodes 21, and it can also be ensured that ink circulates in the region limited by the pixel column openings 'A', and ink with different colors does not mix.

Optionally, as shown in FIG. 2, in the display substrate provided by embodiments of the present disclosure, the first pixel defining structure 31 and the second pixel defining structure 32 may be integrally formed by adopting the same material.

Specifically, the first pixel defining structure 31 and the second pixel defining structure 32 are manufactured by the same material through a halftone process. The material is a material such as polyimide and polymethacrylates carrying hydrophobic functional groups. For example, the hydrophobic functional groups may be fluorine (—F). When being subjected to a specific light irradiation condition, a structure of the above hydrophobic functional groups can be changed, so that hydrophilic and hydrophobic properties of the material are changed.

In actual production, the first pixel defining structure 31 formed by the above material after being treated through the halftone process has lyophobicity. The second pixel defining structure 32 after being treated through the halftone process has lyophilicity. That is, after being treated through the halftone process, the formed pixel defining structure 3 not only includes the first pixel defining structure 31 and the second pixel defining structure 32 with the different thicknesses, and the lyophilicity and lyophobicity of the first pixel defining structure 31 and the second pixel defining structure 32 are also different.

According to the display substrate provided by the embodiments of the present disclosure, because the first pixel defining structure 31 and the second pixel defining structure 32 have the hydrophobicity and hydrophilcity respectively, the ink circulates in the pixel column openings 'A' advantageously and is not prone to overflowing into the adjacent pixel column opening A. The pixel defining structure 3 can be formed by one material through the halftone process, process steps are reduced, and the production cost of the display substrate is reduced advantageously.

Alternatively, optionally, as shown in FIG. 3, a material of the first pixel defining structure 31 is a lyophobic material, and a material of the second pixel defining structure 32 is a lyophilic material. The first pixel defining structure 31 is located on one side of the second pixel defining structure 32 away from the substrate 1.

The first pixel defining structure 31 and the second pixel defining structure 32 in the display substrate provided by the embodiments of the present disclosure are manufactured by adopting the hydrophobic material and the hydrophilic material respectively, so that the ink circulates in the pixel column openings 'A' advantageously and is not prone to overflowing into the adjacent pixel column opening A.

Optionally, as shown in FIG. 1 and FIG. 4-FIG. 7, in the display substrate provided by the embodiments of the present disclosure, the virtual pixel region 121 includes a first virtual pixel region 121a and a second virtual pixel region 121b located on one side of the display region 11 away from the first virtual pixel region 121a. Both the first virtual part 412 and the second virtual part 422 extend in the second direction X, the first virtual part 412 is in the first virtual pixel region 121a, and the second virtual part 422 is in the second virtual pixel region 121b.

According to the display substrate provided by the embodiments of the present disclosure, the first virtual part 412 and the second virtual part 422 are located on the opposite sides of the display region 11, and thus the first virtual part 412 and the second virtual part 422 can be prevented from occupying a large space, thereby preventing increase of a bezel width.

Figure 4:
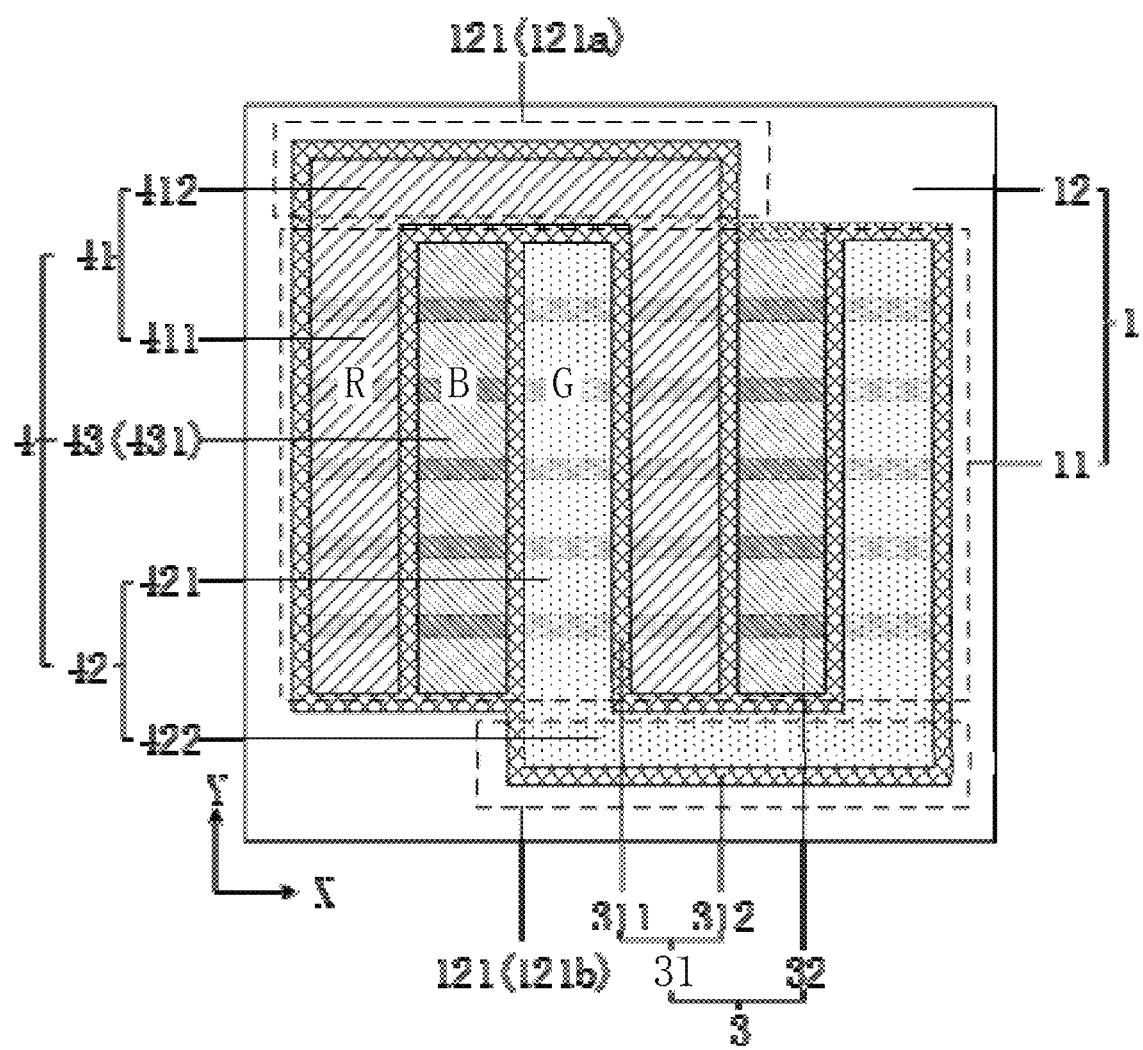
FIG. 4 is a schematic top view of another display substrate provided by an embodiment of the present disclosure.
Figure 5:
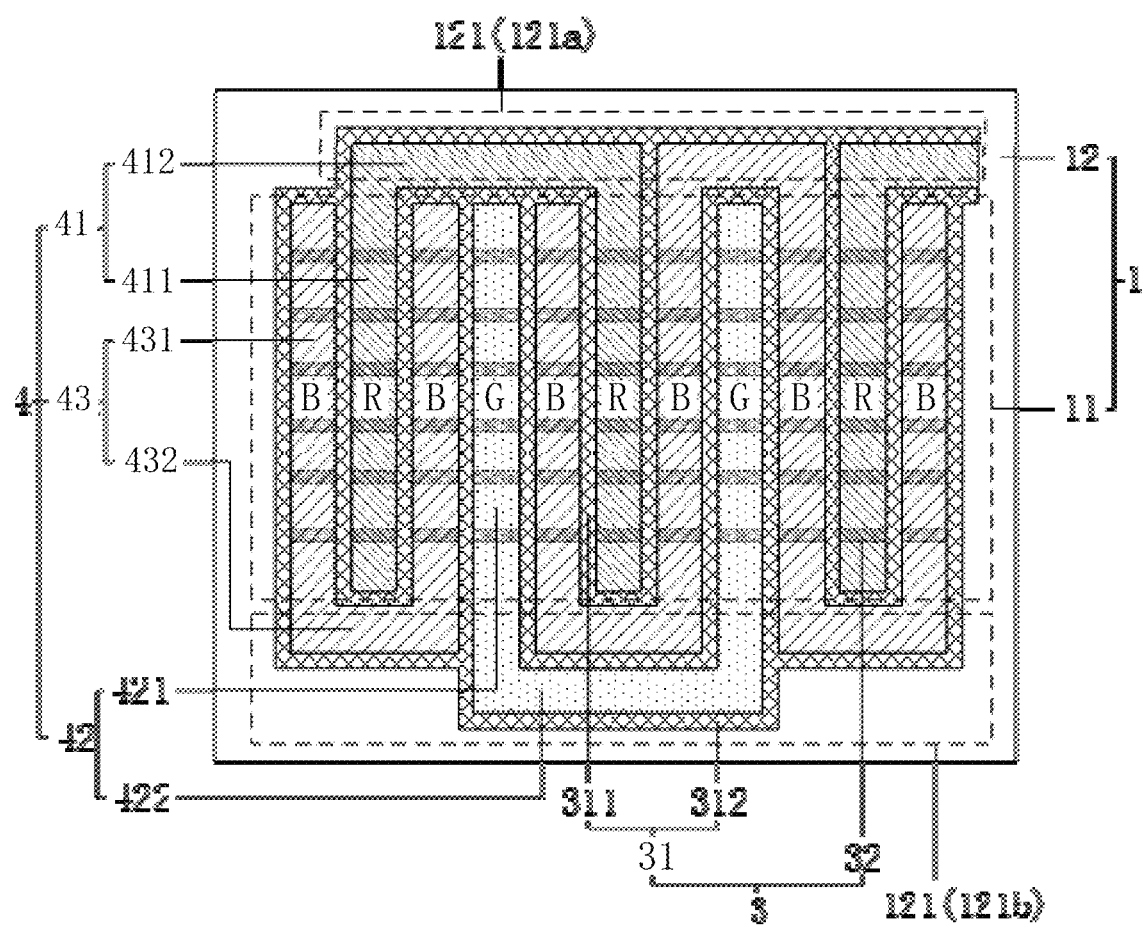
FIG. 5 is a schematic top view of another display substrate provided by an embodiment of the present disclosure.

Optionally, as shown in FIG. 4 and FIG. 5, the first color light-emitting layer 41 includes at least two first virtual parts 412, and each first virtual part 412 is connected with part of the first main body parts 411. The second color light-emitting layer 42 includes at least two second virtual parts 422, and each second virtual part 422 is connected with part of the second main body parts 421.

In the display substrate, part of the main body parts of the light-emitting layers of the same color is connected, so that uniformity of the thicknesses of the light-emitting layers can be effectively improved. Arrangement of pixel columns with different colors for the case that part of the main body parts of the light-emitting layers of the same color is connected is illustrated below in detail.

In some optional implementation, as shown in FIG. 4, the organic light-emitting layer 4 further includes a third color light-emitting layer 43, and the third color light-emitting layer 43 includes third main body parts 431. In the second direction X, the first main body parts 411, the second main body parts 421 and the third main body parts 431 are arranged alternately.

Specifically, as shown in FIG. 4, the first color light-emitting layer 41, the second color light-emitting layer 42 and the third color light-emitting layer 43 respectively correspond to a red organic light-emitting layer R, a green organic light-emitting layer G and a blue organic light-emitting layer B. The blue light-emitting material is low in light-emitting efficiency and short in service life. Therefore, during specific implementation, a distance between first blocking walls 311 for limiting a blue pixel column may be designed to be greater than a distance between first blocking walls 311 for limiting a red pixel column, and greater than a distance between first blocking walls 311 for limiting a green pixel column, so that an area of the third main body part of the blue light-emitting layer is greater than an area of the first main body part of the red light-emitting layer, and greater than an area of the second main body part of the green light-emitting layer. That is, an area of a blue sub-pixel is greater than an area of a red sub-pixel, and greater than an area of a green sub-pixel, so as to compensate the light-emitting efficiency and service life of the blue light-emitting material.

According to the display substrate provided by embodiments of the present disclosure, the main body parts of adjacent organic light-emitting layers in the two colors are connected, thereby improving the uniformity of the thickness of the organic light-emitting layers advantageously.

In some other optional implementation, as shown in FIG. 5, the light-emitting layer of at least one color may further include a third color light-emitting layer 43, and the third color light-emitting layer 43 includes a plurality of third main body parts 431 in the display region 11 and third virtual parts 432 in the virtual pixel region 121. One first main body part 411 or one second main body part 421 are included between two adjacent third main body parts 431, thus it can be considered that in the second direction X, the first main body parts 411 and the second main body parts 421 are arranged alternately, and one third main body part 431 is disposed between the adjacent first main body part 411 and second main body part 421. The third virtual parts 432 are located in the first virtual pixel region 121a and/or the second virtual pixel region 121b.

Specifically, as shown in FIG. 5, the first color light-emitting layer 41, the second color light-emitting layer 42 and the third color light-emitting layer 43 respectively correspond to a red organic light-emitting layer, a green organic light-emitting layer and a blue organic light-emitting layer. In the present embodiments, the quantity of the main body parts of the blue organic light-emitting layer is greater than the quantity of the main body parts of the red organic light-emitting layer, and greater than the quantity of the main body parts of the green organic light-emitting layer, thereby advantageously compensating the light-emitting efficiency of the blue light-emitting material and improving the service life of the display apparatus.

In the display substrate as shown in FIG. 5, the plurality of third virtual parts 432 of the third color light-emitting layer 43 (the blue light-emitting layer) are located in the first virtual pixel region 121a or the second virtual pixel region 121b. For example, the third virtual parts 432 located in the first virtual pixel region 121a can achieve connection of the adjacent third main body parts 431 and will not increase a width of the first virtual pixel region 121a in the first direction Y.

Because the quantity of the blue pixel columns is large, the first blocking walls 311 limiting the red, green and blue pixel columns can be designed to be equidistant. That is, it can be considered that in the second direction X, the first main body part 411, the second main body part 421 and the third main body part 431 have the same width, thereby advantageously reducing the design difficulty of a mask for forming the first pixel defining structure 31 and reducing the difficulty of an etching process of the first pixel defining structure 31.

Figure 6:
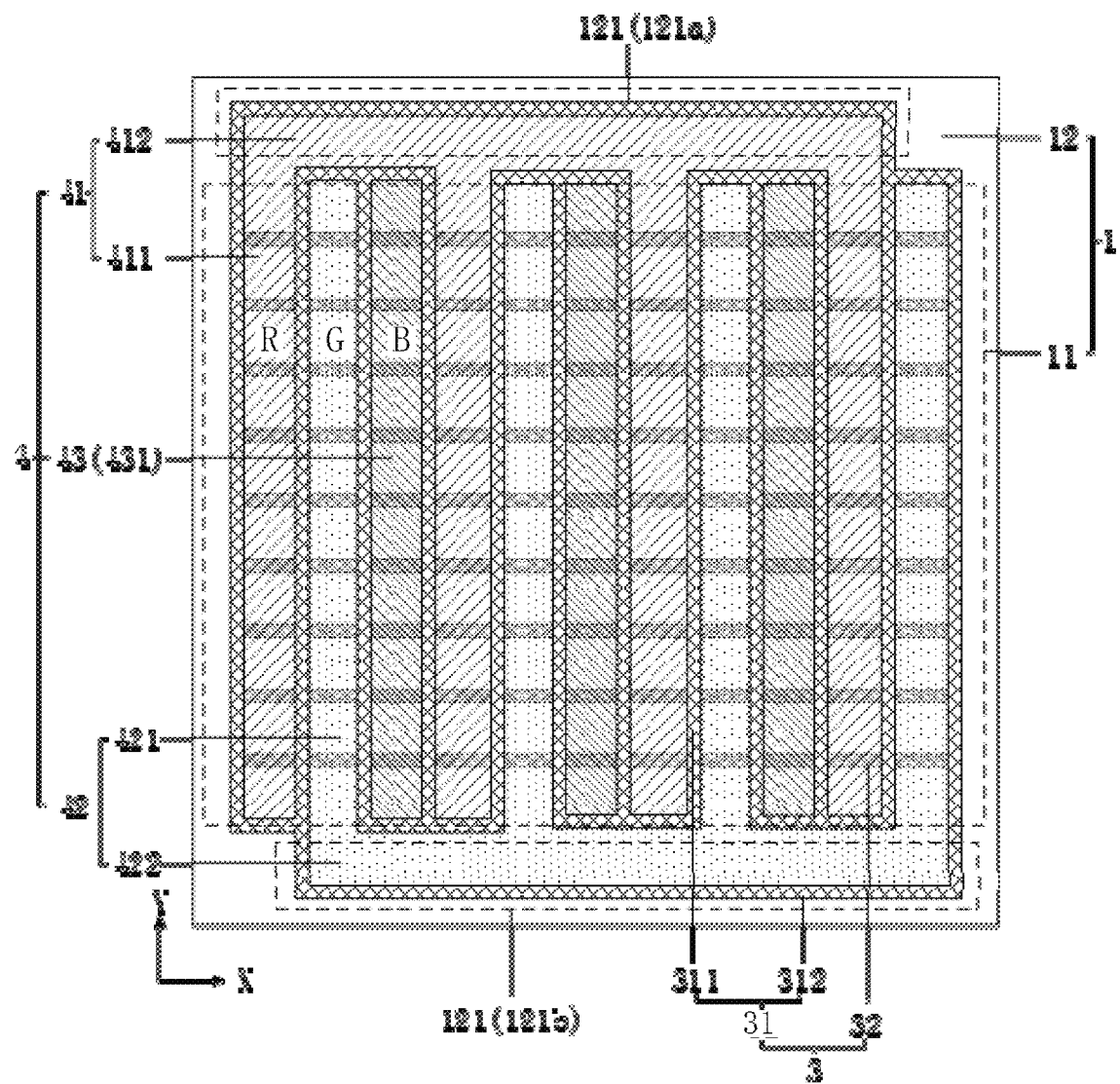
FIG. 6 is a schematic top view of another display substrate provided by an embodiment of the present disclosure.
Figure 7:
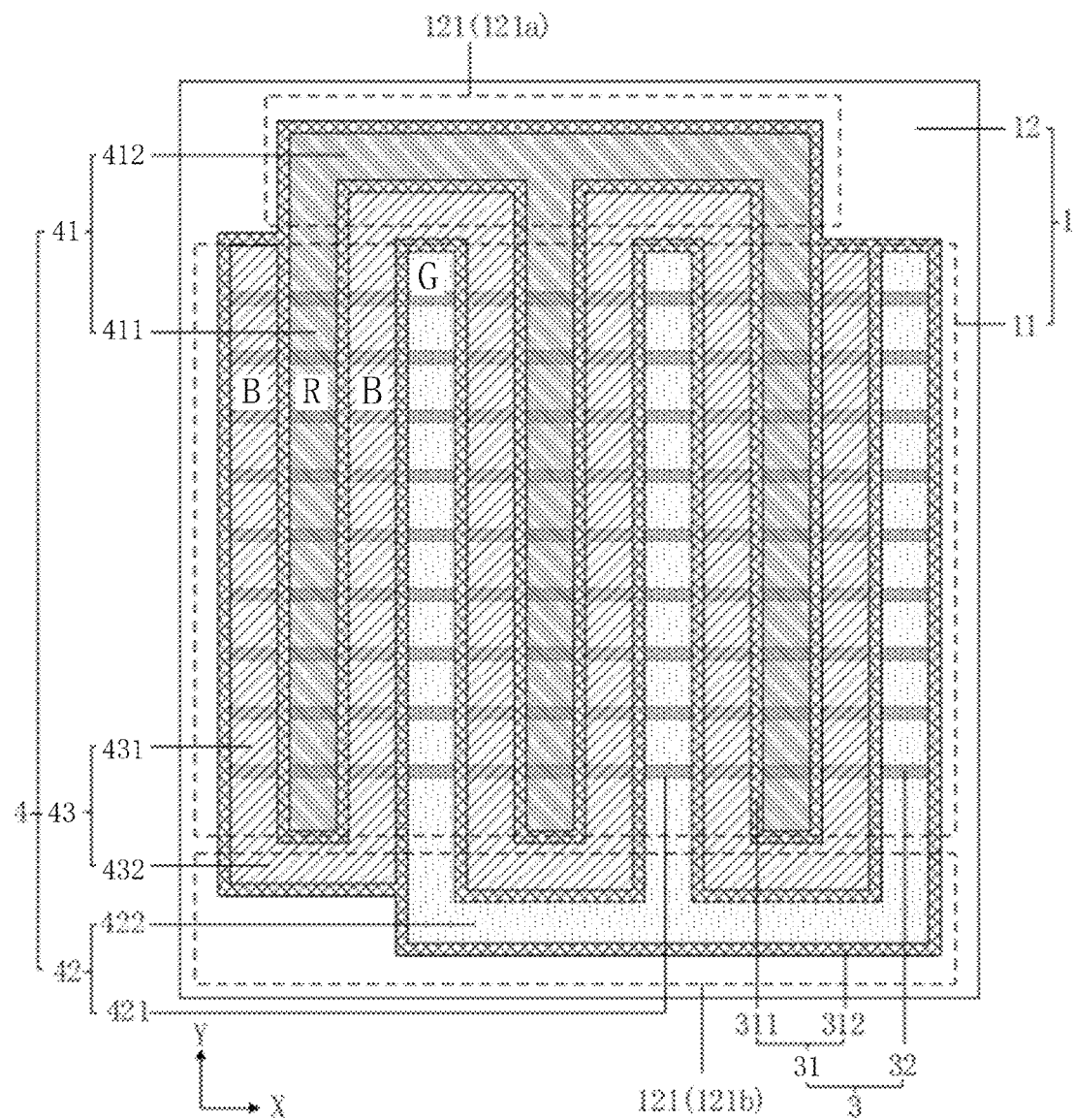
FIG. 7 is a schematic top view of another display substrate provided by an embodiment of the present disclosure.

Optionally, as shown in FIG. 6 and FIG. 7, in the display substrate provided by embodiments of the present disclosure, the first color light-emitting layer 41 includes one first virtual part 412, and the first virtual part 412 is connected with all the first main body parts 411. The second color light-emitting layer 42 includes one second virtual part 422, and the second virtual part 422 is connected with all the second main body parts 421.

In the display substrate, all the main body parts of the light-emitting layers of the same color are connected, so that uniformity of the thicknesses of the light-emitting layers can be effectively improved. Arrangement of the pixel columns with the different colors for the case that all the main body parts of the light-emitting layers of the same color are connected is illustrated below in detail.

In some specific implementation, as shown in FIG. 6, the organic light-emitting layer further includes a third color light-emitting layer 43, and the third color light-emitting layer 43 includes third main body parts 431. In the second direction X, the first main body parts 411, the second main body parts 421 and the third main body parts 431 are arranged alternately.

Specifically, as shown in FIG. 6, the first color light-emitting layer 41, the second color light-emitting layer 42 and the third color light-emitting layer 43 respectively correspond to a red organic light-emitting layer R, a green organic light-emitting layer G and a blue organic light-emitting layer B. All the main body parts of the first color light-emitting layer 41 (the red organic light-emitting layer) and the second color light-emitting layer 42 (the green organic light-emitting layer) are connected through the corresponding virtual parts, while the third color light-emitting layer 43 (the blue organic light-emitting layer) only includes the third main body parts 431, and the third main body parts 431 are not connected. It should be noted that the main body parts of the light-emitting layers of any two colors may be connected according to the actual design situation.

A blue light-emitting material is low in light-emitting efficiency and short in service life, therefore, during specific implementation, a distance between first blocking walls 311 for limiting a blue pixel column may be designed to be greater than a distance between first blocking walls 311 for limiting a red pixel column, and greater than a distance between first blocking walls 311 for limiting a green pixel column, so that an area of the third main body parts of the blue light-emitting layer is greater than an area of the first main body parts of the red light-emitting layer, and greater than an area of the second main body parts of the green light-emitting layer, that is, an area of blue sub-pixels is greater than an area of red sub-pixels, and greater than an area of green sub-pixels, so as to compensate the light-emitting efficiency and service life of the blue light-emitting material.

According to the display substrate provided by embodiments of the present disclosure, the main body parts of the adjacent organic light-emitting layers in the two colors are connected respectively, thereby improving the uniformity of the thickness of the organic light-emitting layers advantageously.

In some other specific implementation, as shown in FIG. 7, the light-emitting layer of at least one color may further include a third color light-emitting layer 43, and the third color light-emitting layer 43 includes a plurality of third main body parts 431 in the display region 11 and third virtual parts 432 in the virtual pixel region 121. One first main body part 411 or one second main body part 421 is included between two adjacent third main body parts 431, thus it can be considered that in the second direction X, the first main body parts 411 and the second main body parts 421 are arranged alternately, and one third main body part 431 is disposed between the adjacent first main body part 411 and second main body part 421. In the second direction, the third virtual parts 432 are arranged alternately in the first virtual pixel region 121a and the second virtual pixel region 121b.

Specifically, as shown in FIG. 7, the first color light-emitting layer 41, the second color light-emitting layer 42 and the third color light-emitting layer 43 respectively correspond to a red organic light-emitting layer, a green organic light-emitting layer and a blue organic light-emitting layer. In the present embodiments, the quantity of the main body parts of the blue organic light-emitting layer is greater than the quantity of the main body parts of the red organic light-emitting layer, and greater than the quantity of the main body parts of the green organic light-emitting layer, thereby advantageously compensating the light-emitting efficiency of the blue light-emitting material and improving the service life of the display apparatus.

In the display substrate as shown in FIG. 7, the plurality of third virtual parts 432 of the third color light-emitting layer 43 (the blue light-emitting layer) are located in the first virtual pixel region 121a or the second virtual pixel region 121b. For example, the third virtual parts 432 located in the first virtual pixel region 121a can achieve connection of the adjacent third main body parts 431 and will not increase a width of the first virtual pixel region 121a in the first direction Y.

As shown in FIG. 7, because the quantity of the blue pixel columns is large, the first blocking walls 311 limiting the red, green and blue pixel columns can be designed to be equidistant. That is, it can be considered that in the second direction X, the first main body part 411, the second main body part 421 and the third main body part 431 have the same width, thereby advantageously reducing the design difficulty of a mask for forming the first pixel defining structure 31 and reducing the difficulty of an etching process of the first pixel defining structure 31.

According to the display substrate provided by the embodiments of the present disclosure, the main body parts of the organic light-emitting layers of all the colors are completely connected respectively, so that ink of each color is communicated on the overall display substrate, thereby improving the uniformity of the thickness of the organic light-emitting layers advantageously.

Figure 8:
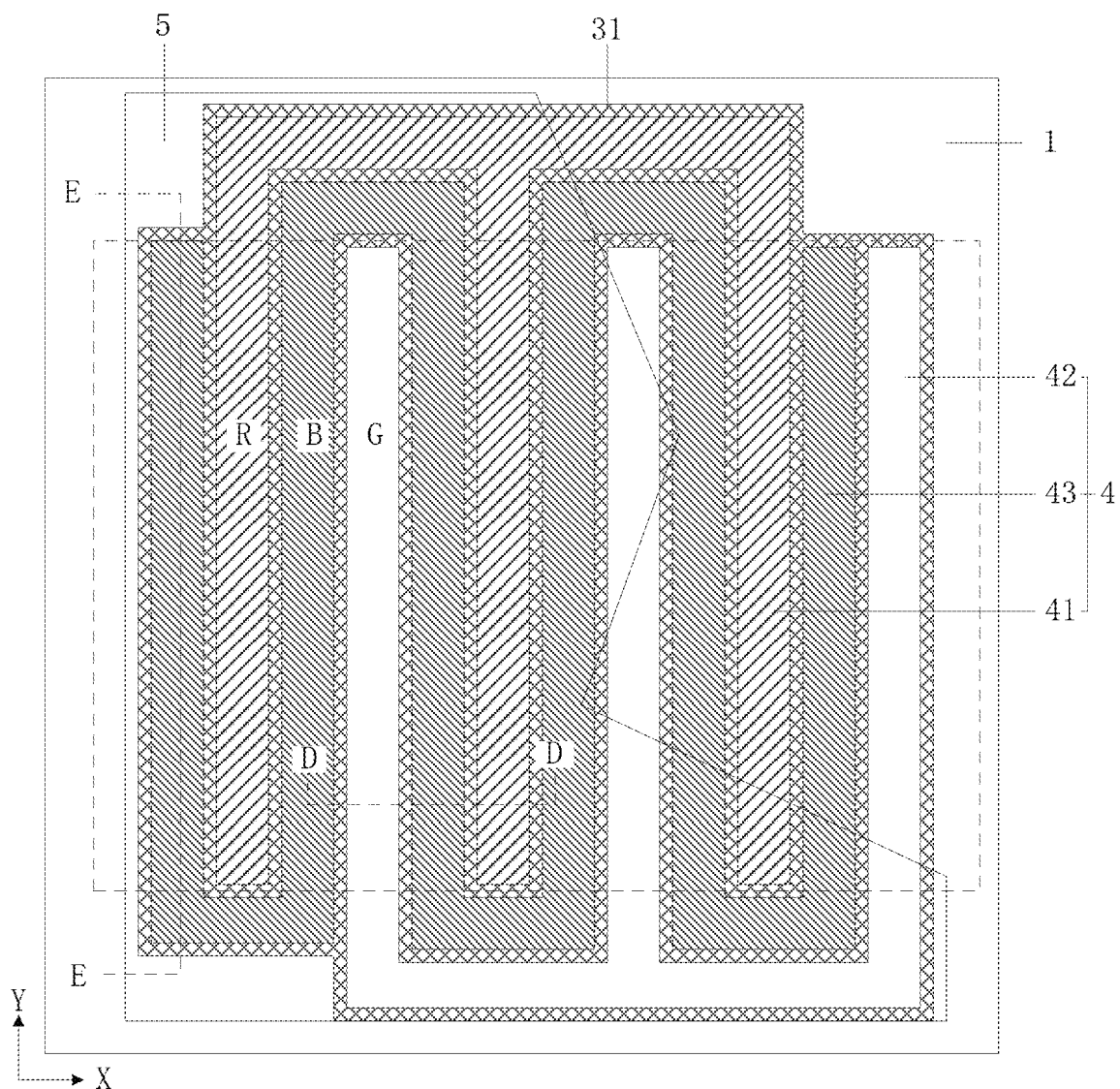
FIG. 8 is a schematic top view of another display substrate provided by an embodiment of the present disclosure.
Figure 9:
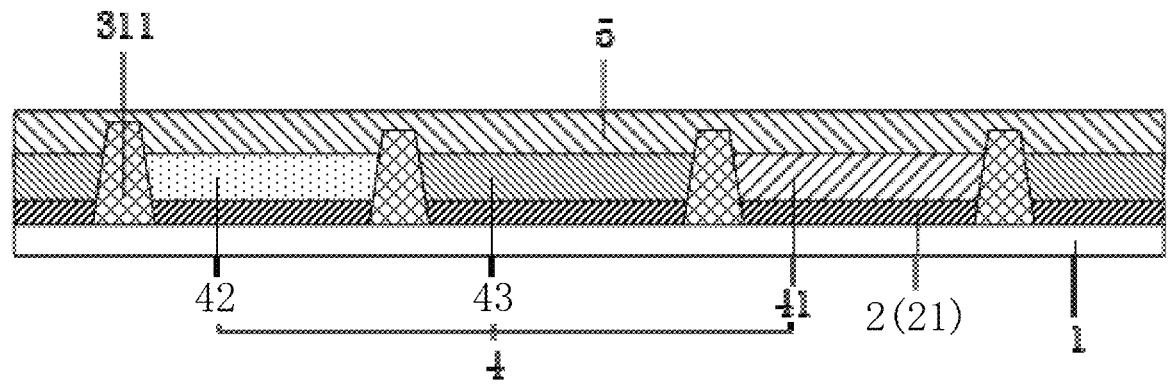
FIG. 9 is a schematic section diagram of the display substrate shown in FIG. 8 along a line D-D.
Figure 10:
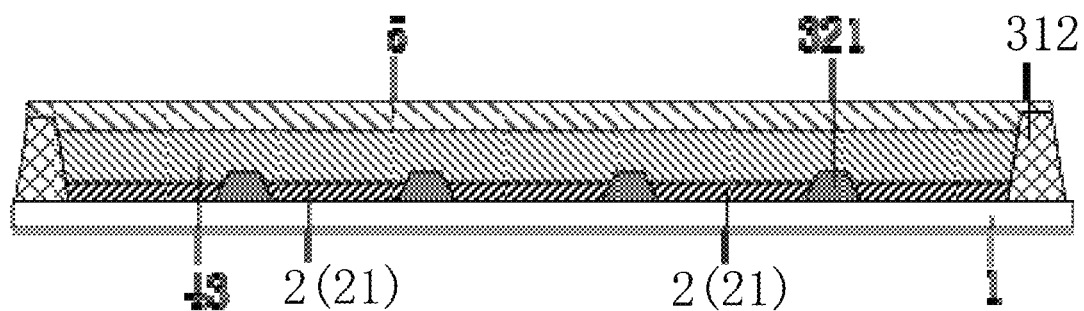
FIG. 10 is a schematic section diagram of the display substrate shown in FIG. 8 along a line E-E.

Optionally, please with reference to FIG. 8 to FIG. 10, the display substrate provided by embodiments of the present disclosure may further include a second electrode layer 5 formed on one side of the organic light-emitting layer 4 away from the substrate 1. Usually, the first electrode layer 2 serves as an anode layer, and the second electrode layer 5 serves as a cathode layer.

Optionally, the display substrate may further include a driving circuit located between the first electrode layer 2 and the substrate 1. Specifically, the driving circuit includes a thin film transistor(s), a capacitor(s), a gate line(s), a data line(s), a sensing line(s) and the like. In a manufacturing process, a corresponding active layer, conductive layer, insulating layer and the like need to be formed, and patterning treatment is performed on the active layer, the conductive layer and the insulating layer so as to obtain the thin film transistor(s), the capacitor(s), the gate line(s), the data line(s), the sensing line(s) and the like.

Figure 11:
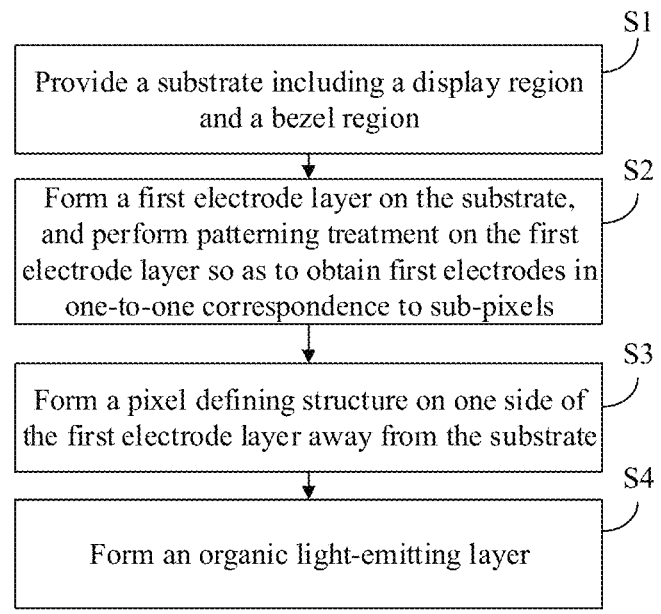
FIG. 11 is a schematic flow diagram of a method for preparing a display substrate provided by an embodiment of the present disclosure.

Embodiments of the present disclosure further provide a method for preparing a display substrate. As shown in FIG. 11 and with reference to FIG. 1, the method for preparing the display substrate provided by embodiments of the present disclosure includes the following operations.

S1: a substrate 1 is provided, and the substrate 1 includes a display region 11 and a bezel region 12.

S2: a first electrode layer 2 is formed on the substrate 1, and patterning treatment is performed on the first electrode layer 2 so as to obtain first electrodes 21 in one-to-one correspondence to sub-pixels.

S3: a pixel defining structure 3 is formed on one side of the first electrode layer 2 away from the substrate 1.

The pixel defining structure 3 includes a first pixel defining structure 31 and a second pixel defining structure 32 with a thickness being smaller than that of the first pixel defining structure 31. The first pixel defining structure 31 includes first blocking walls 311 in the display region 11 and second blocking walls 312 in the bezel region 12. The first blocking wall 311 extend in the first direction Y. Adjacent first blocking walls 311 limit pixel column openings 'A' in one-to-one correspondence with the pixel columns. The second blocking wall 312 extends in a second direction X and is connected with first blocking walls 311 limiting at least two adjacent pixel column openings 'A' of the same color. The second pixel defining structure 32 includes a plurality of third blocking walls 321 in the display region 11. The third blocking walls 321 are in the pixel column openings 'A' so as to divide the pixel column openings 'A' into pixel openings M in one-to-one correspondence with the sub-pixels. An orthographic projection of one pixel opening M on the substrate 1 is within an orthographic projection of one first electrode 21 on the substrate 1, and the second direction X intersects with the first direction Y.

S4: an organic light-emitting layer 4 is formed.

The light-emitting layer 4 may include a first color light-emitting layer 41 and a second color light-emitting layer 42. The first color light-emitting layer 41 includes first main body parts 411 in the display region 11 and a first virtual part(s) 412 located in the bezel region 12. The first main body parts 411 overspread a region limited by the corresponding pixel column openings 'A', and the first virtual part 412 is connected with at least two adjacent first main body parts 411. The second color light-emitting layer 42 includes second main body parts 421 in the display region 11 and a second virtual part(s) 422 in the bezel region 12. The second main body parts 421 overspread the region limited by the corresponding pixel column openings 'A', and the second virtual part 422 is connected with at least two adjacent second main body parts 421.

The method for preparing the display substrate provided by the embodiments of the present disclosure utilizes the first pixel defining structure 31 to form the plurality of pixel column openings 'A', and utilizes the second pixel defining structure 32 to divide the sub-pixels. The pixel column openings 'A' corresponding to at least one color are communicated in the virtual pixel region 12, so that ink forming all the sub-pixels of the at least one color can be circulated in the overall display substrate. Even if the pixel column openings 'A' corresponding to part of colors are not communicated, the pixel column openings 'A' corresponding to the sub-pixels of the part of colors enables ink of the overall column of sub-pixels be circulated in the pixel column openings 'A'. In this way, uniformity of a thickness of the organic light-emitting layer of all colors is improved advantageously, thereby improving a display effect of a display apparatus.

Optionally, please with reference to FIG. 1 and FIG. 2, in the method for preparing the display substrate provided by the embodiments of the present disclosure, operation S3 includes: a pixel defining material layer is formed on one side of the substrate 1, the patterning treatment is performed on the pixel defining material layer by adopting a halftone process so as to form the first pixel defining structure 31 and the second pixel defining structure 32, at least part of the first pixel defining structure 31 before the halftone process treatment has the hydrophobicity, and the second pixel defining structure 32 after the halftone process treatment has the hydrophilcity.

Because the halftone process enables the irradiated situation of different regions be different, the first pixel defining structure 31 and the second pixel defining structure 32 with the different thicknesses can be formed, and when the material is subjected to specific irradiation, a structure of functional groups on a surface of the material can be changed, so that hydrophilic and hydrophobic properties of the material are changed. Based on the above principle, the thicknesses and the hydrophilic and hydrophobic properties of the first pixel defining structure 31 and the second pixel defining structure 32 can be controlled by adjusting parameters of the halftone process.

According to the method for preparing the display substrate provided by the embodiments of the present disclosure, because the first pixel defining structure 31 and the second pixel defining structure 32 have the hydrophobicity and hydrophilcity respectively, the ink circulates in the first openings 212 advantageously and is not prone to overflowing into an adjacent pixel column opening 'A'. The pixel defining structure 3 can be formed by one material through the halftone process, process steps are reduced, and the production cost of the display substrate is reduced advantageously.

Optionally, please with reference to FIG. 1 and FIG. 3, in the method for preparing the display substrate provided by the embodiments of the present disclosure, operation S3 includes:

a second pixel defining material layer is formed on one side of the substrate 1, and the patterning treatment is performed on the second pixel defining material layer so as to obtain the second pixel defining structure 32; and the first pixel defining material layer is formed on one side of the second pixel defining material layer away from the substrate 1, and the patterning treatment is performed on the first pixel defining material layer so as to obtain the first pixel defining structure 31.

The method for preparing the display substrate provided by the embodiments of the present disclosure respectively adopts a hydrophobic material and a hydrophilic material to manufacture the first pixel defining structure 31 and the second pixel defining structure 32, and the obtained pixel defining structure is beneficial to a situation that the ink circulates in the pixel column openings 'A' and is not prone to overflowing into the adjacent pixel column opening 'A'.

Optionally, please with reference to FIG. 8 to FIG. 10, the method for preparing the display substrate provided by the embodiments of the present disclosure further includes the following operations: a second electrode layer 5 is formed on one side of the organic light-emitting layer 4 away from the substrate 1. Usually, the first electrode layer 2 serves as an anode layer, and the second electrode layer 5 serves as a cathode layer.

Optionally, the display substrate provided by the embodiments of the present disclosure further includes a driving circuit located between the first electrode layer 2 and the substrate 1. The method for preparing the display substrate provided by the embodiments of the present disclosure further includes: the driving circuit is formed on the substrate 1 before the first electrode layer 2 is formed.

Specifically, the driving circuit includes a thin film transistor(s), a capacitor(s), a gate line(s), a data line(s), a sensing line(s) and the like. In a manufacturing process, a corresponding active layer, conductive layer, insulating layer and the like need to be formed, and patterning treatment is performed on the active layer, the conductive layer and the insulating layer so as to obtain the thin film transistor(s), the capacitor(s), the gate line(s), the data line(s), the sensing line(s) and the like.

Figure 12:
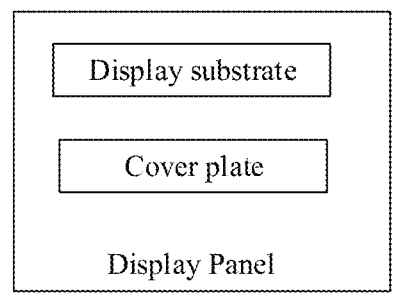
FIG. 12 is a schematic diagram of a frame structure of a display panel provided by an embodiment of the present disclosure.

Based on the same inventive concept, embodiments of the present disclosure further provide a display panel. As shown in FIG. 12, the display panel includes the display substrate provided by the above embodiments and has the beneficial effects of the display substrate in the above embodiments, which is not repeated here.

The display panel provided by embodiments of the present disclosure further includes an encapsulation structure, and the encapsulation structure is used for protecting the display panel. Specifically, the encapsulation structure may be a thin film encapsulation structure, so as to prevent water oxidation from corroding the display substrate.

In addition, the display panel provided by embodiments of the present disclosure may further include a cover plate, for further protecting the display panel.

Figure 13:
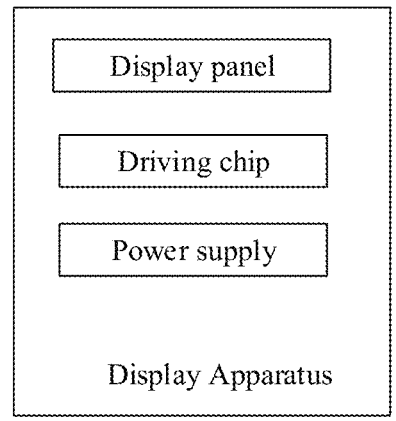
FIG. 13 is a schematic diagram of a frame structure of a display apparatus provided by an embodiment of the present disclosure.

Based on the same inventive concept, embodiments of the present disclosure further provide a display apparatus. As shown in FIG. 13, the display apparatus includes the display panel in the embodiments and has the beneficial effects of the display panel provided by the above embodiments of the present disclosure, which is not repeated here.

Specifically, the display apparatus provided by the embodiments of the present disclosure may further include a driving chip and a power supply. The driving chip provides a driving signal for the display panel, and the power supply provides electrical energy for the display panel.

By applying the embodiments of the present disclosure, the following beneficial effects may be at least achieved.

The display substrate, the display panel and the display apparatus provided by the embodiments of the present disclosure utilizes the first pixel defining structure to form the plurality of openings corresponding to the pixel columns, and utilizes the second pixel defining structure to divide the sub-pixels, and the pixel column openings corresponding to each of at least one color are communicated in the virtual pixel region, so that the ink (the solution containing the organic light-emitting layer material) forming the sub-pixels of the color can be circulated in the plurality of pixel column openings. Even if part of pixel column openings is not communicated, the ink in the part of pixel column openings may also be circulated in the part of pixel column openings. In this way, the uniformity of the thickness of the organic light-emitting layer is improved advantageously, thereby improving the display effect of the display apparatus.

Those skilled in the art should understand that steps, measures and solutions in various operations, methods and flows discussed in the present disclosure may be alternated, changed, combined or deleted. Further, other steps, measures and solutions having various operations, methods and flows discussed in the present disclosure may also be alternated, changed, rearranged, decomposed, combined or deleted. Further, steps, measures and solutions having various operations, methods and flows disclosed in the present disclosure in the related technology may also be alternated, changed, rearranged, decomposed, combined or deleted.

In the description of the present disclosure, it needs to be understood that orientation or a position relationship indicated by the terms "center", "upper", "lower", "front", "rear", "left", "right", "vertical", "horizontal", "top", "bottom", "inner", "outer", and the like is orientation or a position relationship shown on the basis of the drawings, is only to facilitate description of the present disclosure and description simplification, rather than indicating or implying that the indicated apparatus or element must have a specific orientation or be constructed and operated in the specific orientation, and therefore cannot be understood as limitation to the present disclosure.

The terms "first" and "second" are only configured to describe the purpose, and cannot be understood as indicating or implying relative importance or implicitly indicating the quantity of the indicated technical features. Therefore, the features with the limited "first" and "second may explicitly or implicitly include one or more features. In the description of the present disclosure, unless otherwise noted, the meaning of "the plurality of" is two or more.

In the description of the present disclosure, it should be noted that unless otherwise expressly stated and limited, the terms "mount", "connect" and "link" should be understood in a broad sense, for example, may be fixed connection, or detachable connection, or integrated connection; and may be direct connection, or indirect connection through an intermediate media, or internal communication of the two elements. Those skilled in the art may understand the specific meaning of the above terms in the present disclosure according to the specific situation.

In the description of the present specification, specific features, structures, materials or characteristics may be combined in a proper mode in any one or more embodiments or examples.

It should be understood that although all the steps in the flow diagrams of the drawings are sequentially shown according to arrow indication, these steps are not necessarily executed sequentially according to an order indicated by arrows. Unless expressly stated herein, execution of these steps has no strict order limitation, and these steps may be executed in other orders. Moreover, at least a part of steps in the flow diagrams of the drawings may include a plurality of substeps or a plurality of stages, these substeps or stages are not necessarily executed and completed at the same moment, and may be executed at the different moments. The execution orders are not necessarily execution in sequence, and these substeps or stages may be alternately executed with other steps or at least part of the substeps or stages of other steps.

The above mentioned is only part of the implementation of the present disclosure. It should be noted that those skilled in the art should further make various improvements and embellishments without departing from the principle of the present disclosure, and these improvements and embellishments should also be regarded as the protection scope of the present disclosure.

What is claimed is:

1. A display substrate, comprising sub-pixels with at least two different colors, wherein the sub-pixels are arranged as pixel columns in a first direction, all sub-pixels at a same pixel column have a same color, and the display substrate comprises:
 a substrate, comprising:
  a display region, and
  a bezel region around the display region;
 a first electrode layer, on one side of the substrate and comprising:
  first electrodes in one-to-one correspondence with the sub-pixels;
 a pixel defining structure, comprising:
  a first pixel defining structure, and
  a second pixel defining structure with a thickness being smaller than a thickness of the first pixel defining structure,
  wherein the first pixel defining structure comprises:
   first blocking walls in the display region, and
   a second blocking wall in the bezel region,
   wherein the first blocking wall extends in the first direction, and adjacent first blocking walls limit pixel column openings in one-to-one correspondence with the pixel columns; and
   the second blocking wall extends in a second direction and is connected with first blocking walls limiting at least two adjacent pixel column openings of a same color;
  the second pixel defining structure comprises:
   third blocking walls in the display region,
   wherein the third blocking walls are in the pixel column openings and are configured to divide the pixel column openings into pixel openings in one-to-one correspondence with the sub-pixels;
   wherein an orthographic projection of one pixel opening on the substrate is within an orthographic projection of one first electrode on the substrate, and the second direction intersects with the first direction; and
 an organic light-emitting layer, at least comprising:
  two light-emitting layers with different colors,
  wherein at least one light-emitting layer each of one color comprises:
   main body parts in the display region, and
   a virtual part in the bezel region,
   wherein the main body parts overspread a region limited by corresponding pixel column openings, and
   the virtual part is connected with at least two adjacent main body parts in the light-emitting layer of a same color.

2. The display substrate according to claim 1, wherein the bezel region comprises:
 a virtual pixel region;
 wherein the virtual part is in the virtual pixel region.

3. The display substrate according to claim 2, wherein the virtual pixel region comprises:
 a first virtual pixel region, and
 a second virtual pixel region on one side of the display region away from the first virtual pixel region;

wherein the at least one light-emitting layer comprises:
 a first color light-emitting layer and
 a second color light-emitting layer,
 wherein the first color light-emitting layer comprises:
  first main body parts, and
  a first virtual part,
 the second color light-emitting layer comprises:
  second main body parts, and
  a second virtual part; and
 wherein both the first virtual part and the second virtual part extend in the second direction, the first virtual part is in the first virtual pixel region, and the second virtual part is in the second virtual pixel region.

4. The display substrate according to claim 3, wherein the first color light-emitting layer comprises at least two first virtual parts, and each first virtual part is connected with part of the first main body parts;
 the second color light-emitting layer comprises at least two second virtual parts, and each second virtual part is connected with part of the second main body parts.

5. The display substrate according to claim 4, wherein the at least one light-emitting layer further comprises:
 a third color light-emitting layer,
 wherein the third color light-emitting layer comprises:
  third main body parts, and
  third virtual parts;
 in the second direction, the first main body parts and the second main body parts are arranged alternately, and one third main body part is disposed between adjacent first main body part and second main body part; and
 the third virtual parts are in the first virtual pixel region and/or the second virtual pixel region.

6. The display substrate according to claim 3, wherein the first color light-emitting layer comprises one first virtual part, and the first virtual part is connected with all the first main body parts; and
 the second color light-emitting layer comprises one second virtual part, and the second virtual part is connected with all the second main body parts.

7. The display substrate according to claim 6, wherein the at least one light-emitting layer further comprises:
 a third color light-emitting layer,
 wherein the third color light-emitting layer comprises:
  third main body parts, and
  third virtual parts;
 in the second direction, the first main body parts and the second main body parts are arranged alternately, and one third main body part is disposed between adjacent first main body part and second main body part; and
 in the second direction, the third virtual parts are arranged alternately in the first virtual pixel region and the second virtual pixel region.

8. The display substrate according to claim 4, wherein the organic light-emitting layer further comprises:
 a third color light-emitting layer,
 wherein the third color light-emitting layer comprises:
  third main body parts,
  wherein in the second direction, the first main body parts, the second main body parts and the third main body parts are arranged alternately.

9. The display substrate according to claim 8, wherein the third color light-emitting layer is a blue light-emitting layer;
 in the second direction, widths of both the first main body part and the second main body part are smaller than a width of the third main body part.

10. The display substrate according to claim 5, wherein the third color light-emitting layer is a blue light-emitting layer; and in the second direction, the first main body part, the second main body part and the third main body part have a same width.

11. The display substrate according to claim 1, wherein orthographic projections of the virtual parts on the substrate do not overlap with orthographic projections of the first electrodes on the substrate.

12. The display substrate according to claim 1, wherein a thickness of the first pixel defining structure is 1.2 μm-2 μm, and a thickness of the second pixel defining structure is 0.5 μm-1 μm.

13. The display substrate according to claim 1, wherein the first pixel defining structure and the second pixel defining structure are integrally formed by adopting a same material.

14. The display substrate according to claim 1, wherein the first pixel defining structure is on one side of the second pixel defining structure away from the substrate.

15. The display substrate according to claim 1, wherein a material of the first pixel defining structure is a lyophobic material, and a material of the second pixel defining structure is a lyophilic material.

16. A display panel, comprising the display substrate according to claim 1.

17. A display apparatus, comprising the display panel according to claim 16.

* * * * *